US011342736B2

(12) United States Patent
Wood et al.

(10) Patent No.: US 11,342,736 B2
(45) Date of Patent: May 24, 2022

(54) ELECTRICAL CONTACT FAULT DIAGNOSIS

(71) Applicant: VESTAS WIND SYSTEMS A/S, Aarhus N (DK)

(72) Inventors: Arran Wood, Cowes (GB); Stephen Buggy, Cowes (GB); John Bengtson, Arhus C (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 222 days.

(21) Appl. No.: 16/627,457

(22) PCT Filed: Jun. 15, 2018

(86) PCT No.: PCT/DK2018/050145
§ 371 (c)(1),
(2) Date: Dec. 30, 2019

(87) PCT Pub. No.: WO2019/001658
PCT Pub. Date: Jan. 3, 2019

(65) Prior Publication Data
US 2021/0151975 A1    May 20, 2021

(30) Foreign Application Priority Data

Jun. 30, 2017  (DK) .............................. PA201770534

(51) Int. Cl.
*F03D 17/00*      (2016.01)
*F03D 80/40*      (2016.01)
(Continued)

(52) U.S. Cl.
CPC ............. *H02H 3/08* (2013.01); *F03D 7/0264* (2013.01); *F03D 17/00* (2016.05); *F03D 80/40* (2016.05);
(Continued)

(58) Field of Classification Search
CPC ........ F03D 11/00; F03D 80/40; F03D 7/0264; F03D 80/60; G01R 31/3277; H02H 3/042; Y02E 10/72
See application file for complete search history.

(56) References Cited

U.S. PATENT DOCUMENTS 5,170,310 A      12/1992  Studtmann et al.
10,927,821 B2 *   2/2021  Badger ................... H05B 3/34
(Continued)

FOREIGN PATENT DOCUMENTS

CN      102236060 A     11/2011
CN      102783246 A     11/2012
(Continued)

OTHER PUBLICATIONS

Danish Patent and Trademark Office Search Report for PA 2017 70534 dated Nov. 2, 2017.
(Continued)

*Primary Examiner* — Sisay G Tiku
(74) *Attorney, Agent, or Firm* — Patterson + Sheridan, LLP

(57) ABSTRACT

The present invention relates to a method of identifying an electrical contact fault in a wind turbine blade electrical heating system, comprising inserting a predetermined enforced off cycle between or within a switching duty cycle, wherein the switching duty cycle controls the switching of one or more electrical contacts in the electrical heating system, measuring a current consumption during the predetermined enforced off cycle, determining if the measured current consumption exceeds a predetermined threshold, and wherein if the measured current consumption exceeds the predetermined threshold shutting down at least part of the electrical heating system. The present invention also relates
(Continued)

to a wind turbine with one or more wind turbine blades that can identify an electrical contact fault.

11 Claims, 2 Drawing Sheets

(51) Int. Cl.
    *F03D 7/02*         (2006.01)
    *G01R 31/327*    (2006.01)
    *H02H 3/04*        (2006.01)
    *H02H 3/08*        (2006.01)

(52) U.S. Cl.
    CPC ......... *G01R 31/3277* (2013.01); *H02H 3/042* (2013.01)

(56) References Cited

U.S. PATENT DOCUMENTS

| | | |
|---|---|---|
| 2011/0133743 A1 | 6/2011 | Barton |
| 2011/0290784 A1 | 12/2011 | Orawetz et al. |
| 2013/0022465 A1 | 1/2013 | Stiesdal |
| 2015/0023792 A1* | 1/2015 | Spitzner ................ F03D 80/40 416/1 |
| 2016/0307681 A1* | 10/2016 | Shaffer .............. G07C 9/00309 |
| 2017/0184686 A1 | 6/2017 | Kondo |
| 2017/0192060 A1* | 7/2017 | Pizzuti ................. G01R 31/327 |
| 2020/0300226 A1* | 9/2020 | Buggy .................... F03D 80/40 |
| 2021/0148338 A1* | 5/2021 | Wood ...................... F03D 80/60 |
| 2021/0151975 A1* | 5/2021 | Wood ...................... H02H 3/08 |
| 2021/0175933 A1* | 6/2021 | Pirch .................. G06K 19/0723 |

FOREIGN PATENT DOCUMENTS

| | | |
|---|---|---|
| CN | 102822515 A | 12/2012 |
| CN | 102927656 A | 2/2013 |
| JP | H080184615 A | 7/1996 |
| WO | 9210018 A1 | 6/1992 |
| WO | 2019001658 A1 | 1/2019 |

OTHER PUBLICATIONS

PCT International Search Report for PCT/DK2018/050145 dated Sep. 14, 2018.
Danish Patent and Trademark Office 1st Technical Examination for PA 2017 70534 dated Nov. 3, 2017.
PCT Written Opinion for PCT/DK2018/050145 dated Nov. 3, 2017.
Chinese Office Action for Application No. 201880044012.0 dated Aug. 25, 2020.

* cited by examiner

ELECTRICAL CONTACT FAULT DIAGNOSIS

The present invention relates to the identification of an electrical contact fault diagnosis and, in particular, to the diagnosis of an electrical contact fault in an Electro-Thermal Heating (ETH) system for a Wind Turbine.

BACKGROUND

Wind turbines generate electrical power from wind energy and can be situated on land or off-shore. Wind turbines situated in cold climates can suffer from icing events where ice may be formed on the surface of the wind turbine blades due to freezing water on the cold surface. The accumulation of ice on the surface of a blade can result in undesirable consequences. For example, a change in the profile of the wind turbine blades due to the accumulation of ice may reduce the speed of rotation of the wind turbine. As a result, the wind turbine may operate below optimal speed and efficiency which degrades the performance of the wind turbine. Also, the additional weight of the accumulating ice on the wind turbine blades may cause fatigue and stress failures of the blades.

Therefore, there is a need to be able to prevent or reduce the effects of icing on the blades of a wind turbine in order to prevent damage to the blades and also to increase the performance of a wind turbine.

Various systems and methods have been described to either, or both, to de-ice (e.g. remove ice accumulated) a wind turbine or to provide anti-icing (e.g. prevent ice from accumulating) for a wind turbine.

For example, it is known to attach ETH elements to the wind turbine blades which, when supplied with electrical power, generate heat to increase the surface temperature of the surface of the blade. Such ETH elements may be used for either or both of anti-icing or de-icing of the wind turbine blade.

Each of the heating mats are typically controlled independently, or as a group, in order to generate the relevant heat at predetermined locations in the blade structure. The ETH elements may be turned on and off via an electrical contact such as a relay.

Therefore, if there is a fault with an electrical contact then the ETH element controlled by the faulty electrical contact may remain in the "on" state which can potentially cause significant damage to the blade or even a fire risk by continually generating heat at the location of the ETH element.

The present invention seeks to address, at least in part, the problems and disadvantages described hereinabove and to seek to identify a fault with an electrical contact.

STATEMENT OF INVENTION

According to a first aspect of the present invention there is provided a method of identifying an electrical contact fault in a wind turbine blade electrical heating system, comprising: inserting a predetermined enforced off cycle between or within a switching duty cycle, wherein the switching duty cycle controls the switching of one or more electrical contacts in the electrical heating system; measuring a current consumption during the predetermined enforced off cycle; determining if the measured current consumption exceeds a predetermined threshold; and performing a corrective action if the measured current consumption exceeds the predetermined threshold.

The present invention advantageously enables the determination of a faulty electrical contact in a resistive heating system within a wind turbine blade before the fault causes any significant damage to the blade or the ETH element.

Performing the corrective action may comprise one or more of raising an alarm, shutting down at least part of the electrical heating system, and identifying which one or more electrical contacts has a fault.

Shutting down at least part if the electrical heating system may comprise activating one or more circuit breakers.

Identifying which one or more electrical contacts has a fault may comprise switching on each electrical contact individually; measuring the current consumption; and identifying an electrical contact as being faulty if the measured current consumption does not increase.

Identifying which one or more electrical contacts has a fault may comprise comparing the measured current consumption with a lookup table of current consumption values for each electrical contact to identify an electrical contact as being faulty.

The predetermined enforced off cycle may be of a predetermined duration that is sufficient to enable the identification of a faulty electrical contact.

The electrical heating system may comprise two or more Electro-Thermal Heating elements at predetermined locations on or in the blade; and wherein each Electro-thermal heating element may be connected to an electrical contact.

According to a second aspect of the present invention there is provided a wind turbine comprising: one or more wind turbine blades, wherein each blade comprises a electrical heating system; a plurality of electrical contacts for controlling the electrical heating system according to a switching duty cycle; a current consumption sensor operatively connected to the plurality of electrical contacts; and a processor adapted to perform any one of the method or features described hereinabove.

The electrical heating system may comprises two or more Electro-Thermal Heating elements at predetermined locations on or in the blade; and wherein each Electro-thermal heating element may be connected to an electrical contact.

According to a third aspect of the present invention there is provided a computer program product comprising computer readable executable code for implementing any one of method or features described hereinabove.

DRAWINGS

Embodiments of the present invention will now be described, by way of example only, and with reference to the accompanying drawings, in which.

EMBODIMENTS

Figure 1:
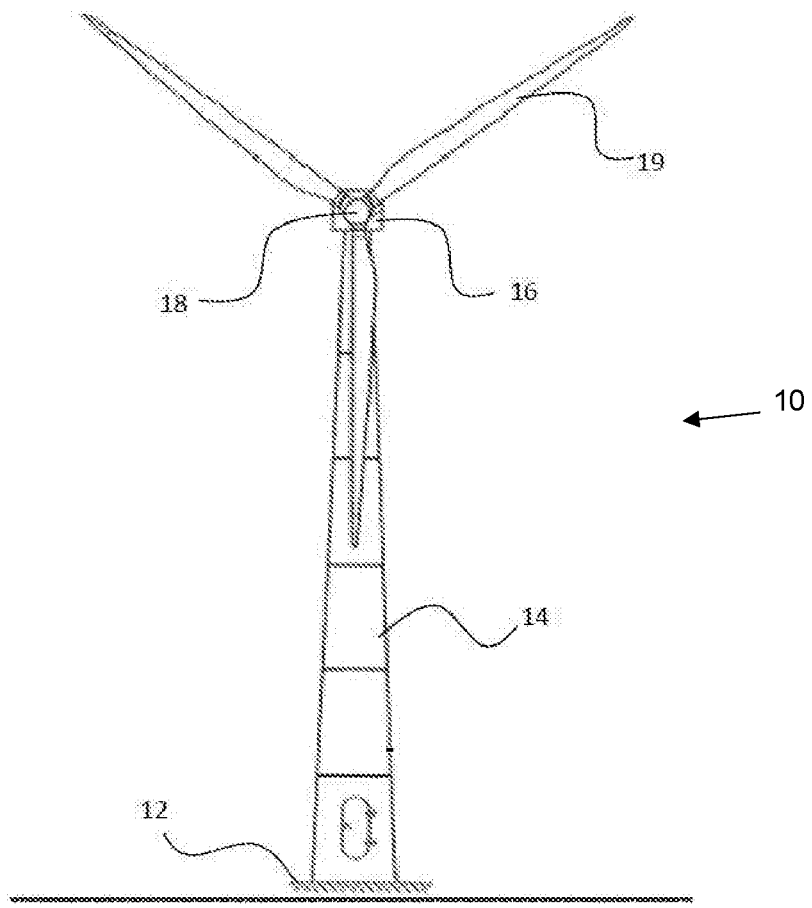
FIG. 1 shows a schematic of a wind turbine according to one or more embodiments of the present invention.

FIG. 1 shows a schematic of a typical wind turbine 10 which includes embodiments of wind turbine blades 19 according to the present invention. The wind turbine 10 is mounted on a base 12 which may be onshore foundations or off-shore platforms or foundations. The wind turbine includes a tower 14 having a number of tower sections. A nacelle 16 is located and attached to the top of tower 14. A wind turbine rotor, connected to the nacelle 16, includes a hub 18 and at least one wind turbine blade 19, where in FIG. 1 three wind turbine blades are shown although any number of wind turbine blades 19 may be present depending on the design and implementation of the wind turbine 10. The wind turbine blades 19 are connected to the hub 18 which in turn is connected to the nacelle 16 through a low speed shaft which extends out of the front of the nacelle 16.

Figure 2:
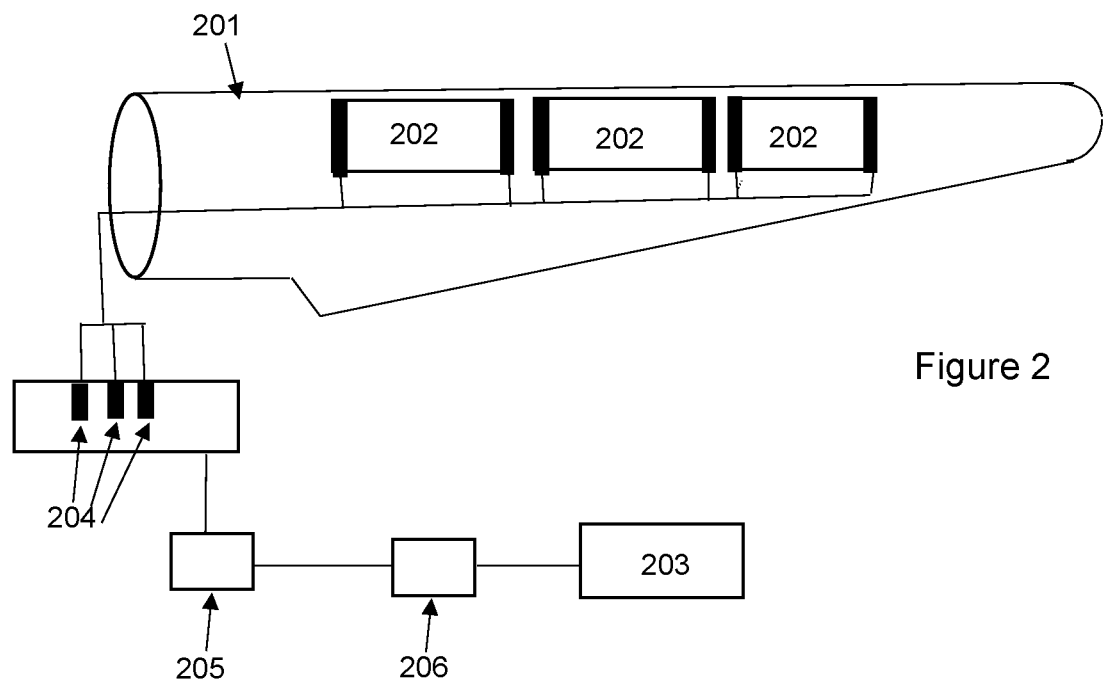
FIG. 2 shows a schematic of a wind turbine blade having a plurality of ETH elements according to one or more embodiments of the present invention.

With reference to FIG. 2, a wind turbine blade 201 may have attached thereto, or embedded within, a plurality of resistive elements, e.g. Electro-Thermal Heating (ETH) elements 202 for generating heat to substantially prevent or remove ice accretion from the wind turbine blade 201.

Each of the plurality of ETH elements 202 is connected to a power supply 203 via a bank of electrical contacts 204, such as an electrical relay. Each electrical contact 204 is operatively coupled to one or more predetermined ETH elements 202 in order to switch the predetermined ETH elements 202 on and off. A current consumption sensor 205 is connected to an input to the electrical contacts 204. A main circuit breaker 206 may also be connected to the input to the electrical contact 204.

Depending on environmental or icing conditions a predetermined number or pattern of ETH elements 202 are activated according to a predefined switching duty cycle. The switching duty cycle (e.g. switching on and off relays over a period of time) enables a power distribution across the ETH elements attached to, or embedded within, the blade in a predefined manner. During a switching duty cycle any number of the ETH elements 202 may be switched on so as to generate heat in the predetermined sections of the blade based on the heating requirements at that given time.

A switching duty cycle may be for any predetermined time period, e.g. 10 seconds, 20 seconds, 30 seconds, and so on. During the switching duty cycle predetermined ETH elements 202 may be switched on and off based on a predefined cycle.

Each ETH element 202 is switched on and off from the power supply via the corresponding electrical contact 204 according to the predefined switching duty cycle. As such, when the electrical contact 204 for a given ETH element 202 is connected, i.e. switched on, the corresponding resistive element 202 receives electrical power as it is connected to the power supply, which causes heat to be generated by the ETH element 202. In contrast, when the electrical contact 204 for a given ETH element 202 is disconnected or open, i.e. switched off, the corresponding resistive element 202 does not receive any electrical power from the power supply.

If an electrical contact 204 is faulty and remains in the switched on state then the ETH element 202 operatively coupled to the electrical contact 204 will continuously be connected to the power supply and therefore be continuously generating heat. This could cause significant damage to the blade at the location of the ETH element, damage to the ETH element, and may even be a fire risk to the blade.

Figure 3:
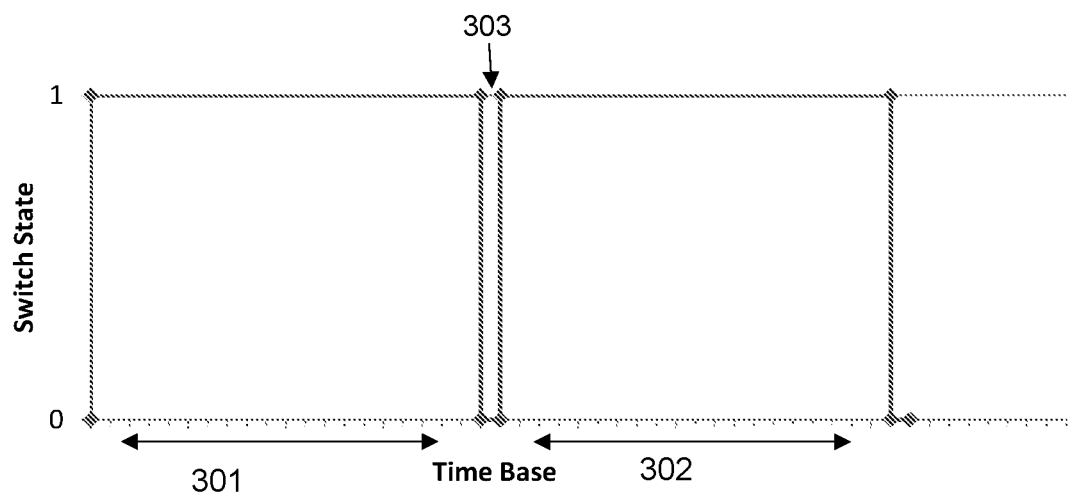
FIG. 3 shows a switching duty cycle for a plurality of ETH elements according to one or more embodiments of the present invention.

With reference to FIG. 3, two switching duty cycles 301, 302 for a predetermined plurality of ETH elements are shown. The ETH elements controlled by the switching duty cycle 301, 302 may be all of the ETH elements or a subset of the total number of resistive elements, for example, the resistive elements in a particular zone or area of the blade such as the leading edge.

In this example of FIG. 3, all of the plurality of ETH elements are to be switched on for the entire period of the switching duty cycle 301 and also for the entire period of the subsequent switching duty cycle 302.

In order to identify a faulty electrical contact an enforced "off" period 303 is inserted between the subsequent switching duty cycles. The duration or time period for the enforced off period 303 is predetermined and set at any time period which is sufficient to enable the identification of a faulty electrical contact. For example, the predetermined time period may be 100 milliseconds (ms), 200 ms, 300 ms, 500 ms, 1 second, 2 seconds, and so on. The example predetermined time periods given above are examples and the predetermined time period can be any suitable time period for the purpose of the invention.

Alternatively, or additionally, the enforced off period may be determined to be a time period within which the current consumption measured will have sufficient time to drop to amps (A), or substantially 0A, when all electrical contacts are open meaning the ETH elements are turned off and all contacts are operating correctly.

During the enforced off period 303, the current consumption on the input to the electrical contacts is measured by an appropriate sensor (shown as 205 in FIG. 2), for example, by a current transducer. The measured current consumption during the enforced off period 303 is then compared to a predetermined threshold. The threshold may be 0A or set to a nominal low current value such as 1 milliamp (mA) or any other suitable value in order to compensate for any inaccuracies in the current measurement sensor. If no current is being drawn by the electrical contacts then the current measured should be 0A, however, the current sensor may measure a nominal low value due to residual current, noise or an inaccuracy in the current measurement and so a threshold above 0A at a nominal predefined low current value may be used in order to prevent false positive of a faulty contact.

Therefore, if during the enforced off-period 303 the current measured by the sensor exceeds the threshold then it is determined that at least one of the electrical contacts is faulty.

Once it is determined that the current measured by the sensor exceeds the threshold, e.g. identifying that at least one of the electrical contacts is faulty, then one or more corrective actions is performed. One corrective action that may be performed is to shut down the ETH element, a part of the ETH heating system, and/or the whole ETH heating system in the blade. For example, the power supply to all of the ETH elements in the blade may be shut off, for example, by a main circuit breaker (shown as 206 in FIG. 2) on the power supply cable to the blade. By breaking the power supply circuit to the electrical contacts then any ETH elements connected to the electrical contacts will not receive any power thereby preventing the ETH elements connected to the faulty electrical contact from being continually heated which prevents damage to the blade and/or to the ETH element.

Additionally, or alternatively, the corrective action performed may comprise raising an alarm.

Additionally, or alternatively, to activating the circuit breaker to prevent any power supply to the electrical contacts once a faulty electrical contact is detected, the corrective action performed may comprise identifying which of the electrical contacts are faulty.

The current drawn by each ETH element will be dependent on the dimensions (e.g. width, length) and construction (e.g. level of resistivity) of the ETH elements. Therefore, based on the measured current during the enforced off period may indicate which of the electrical contacts are faulty. For example, the current that will be consumed by each ETH element may be stored in a look-up table in memory and, based on the measured current consumption, the faulty electrical contacts may be identified.

Alternatively, or additionally, each electrical contact may be switched on individually one after the other and the current measured when each individual electrical contact is switched on.

If the subsequent current measured increases above the current measured during the enforced off period 303 then the electrical contact is operating correctly as when it is switched on an additional current is detected and measured. However, if when an electrical contact is "switched on" and there is no change in the measured current then the electrical contact being tested can be identified as being a faulty electrical contact.

In the above examples, a single power supply is provided or connected to all electrical contacts. Thus, if one electrical contact is detected as being faulty then the power supply to all of the electrical contacts will be disconnected, e.g. by a circuit breaker, meaning that none of the ETH elements will be able to generate heat.

However, as will be appreciated, the electrical contacts may be grouped together where each group is connected to a separate power supply. For example, the electrical contacts connected to ETH elements in a particular location in the blade (e.g. leading edge, trailing edge, central portion of the blade, etc.) may be defined as a group, or electrical contacts connected to ETH elements at different locations in the blade may be grouped together. Therefore, if an electrical contact in a particular group of electrical contacts is detected as being faulty then only the power supply to that group of electrical contacts may be disconnected, e.g. by a circuit breaker. As such, this would enable the ETH elements connected to a different group of electrical contacts to continue operating thereby allowing the connected ETH elements to generate heat in the blade as required. It would also be possible to provide a power supply to each individual electrical contact thereby enabling the power supply to each individual electrical contact to be disconnected if the electrical contact is determined to be faulty.

In the above examples, a single current sensor is provided to measure the current consumption during the enforced off period 303. However, as will be appreciated, alternatively, or additionally, any number of current sensors may be used depending on the design of the power supply and electrical contacts. For example, if the electrical contacts are grouped into separate groups each with a power supply then there may be a current sensor for each group of electrical contacts.

In the above examples, a single the enforced off period 303 is inserted between consecutive switching duty cycles. However, as will be appreciated, either alternatively, or additionally, any number of enforced off periods may be inserted in, or during the switching duty cycles. For example, half way through the switching duty cycle the enforced off period could be inserted.

The examples and embodiments described above are for example purposes only, and it will be appreciated that features of different embodiments or examples may be combined with one another. Embodiments of the present invention have been described, by way of example only, and many modifications or changes may be made to the embodiments and be within the scope of the appended claims.

The invention claimed is:

1. A method of identifying an electrical contact fault in an electrical heating system, comprising:
   inserting a predetermined enforced off cycle between or within a switching duty cycle, wherein the switching duty cycle controls the switching of one or more electrical contacts in the electrical heating system;
   measuring a first current consumption during the predetermined enforced off cycle;
   determining whether the measured first current consumption exceeds a predetermined threshold; and
   performing a corrective action if the measured first current consumption exceeds the predetermined threshold, wherein the corrective action comprises at least one of raising an alarm, shutting down at least part of the electrical heating system, or identifying which of the one or more electrical contacts has a fault by (i) switching on each of the one or more electrical contacts individually, (ii) measuring a second current consumption, and (iii) identifying an electrical contact of the one or more electrical contacts as being faulty if the second current consumption measured when the electrical contact is switched on does not increase.

2. The method according to claim 1, wherein shutting down at least part of the electrical heating system comprises activating one or more circuit breakers.

3. The method according to claim 1, wherein the identifying which of the one or more electrical contacts has a fault comprises:
   comparing the measured current consumption with a lookup table of current consumption values for each electrical contact to identify an electrical contact as being faulty.

4. The method according to claim 1, wherein the predetermined enforced off cycle is of a predetermined duration that is sufficient to enable identification of a faulty electrical contact.

5. The method according to claim 1, wherein the electrical heating system comprises two or more Electro-Thermal Heating elements at predetermined locations on or in a blade of a wind turbine; and wherein each Electro-thermal heating element is connected to an electrical contact of the one or more electrical contacts.

6. A wind turbine comprising:
   one or more wind turbine blades, wherein at least one of the one or more wind turbine blades comprises an electrical heating system;
   one or more electrical contacts for controlling the electrical heating system according to a switching duty cycle;
   a current consumption sensor operatively connected to the one or more electrical contacts; and
   a processor adapted to:
      insert a predetermined enforced off cycle between or within a switching duty cycle, wherein the switching duty cycle controls the switching of the one or more electrical contacts in the electrical heating system;
      measure, using the current consumption sensor, a first current consumption during the predetermined enforced off cycle;
      determine whether the measured first current consumption exceeds a predetermined threshold; and
      perform a corrective action if the measured first current consumption exceeds the predetermined threshold, wherein the corrective action comprises at least one of raising an alarm, shutting down at least part of the electrical heating system, or identifying which of the one or more electrical contacts has a fault by (i) switching on each of the one or more electrical contacts individually, (ii) measuring a second current consumption, and (iii) identifying an electrical contact of the one or more electrical contacts as being faulty if the second current consumption measured when the electrical contact is switched on does not increase.

7. The wind turbine according to claim 6, wherein the electrical heating system comprises two or more Electro-Thermal Heating elements at predetermined locations on or in the at least one of the one or more wind turbine blades; and wherein each Electro-thermal heating element is connected to an electrical contact of the one or more electrical contacts.

8. A computer program product comprising computer readable executable code which, when executed by a processor, performs an operation for identifying an electrical contact fault in an electrical heating system, the operation comprising:
   inserting a predetermined enforced off cycle between or within a switching duty cycle, wherein the switching duty cycle controls the switching of one or more electrical contacts in the electrical heating system;
   measuring a first current consumption during the predetermined enforced off cycle;
   determining whether the measured first current consumption exceeds a predetermined threshold; and
   performing a corrective action if the measured first current consumption exceeds the predetermined threshold, wherein the corrective action comprises at least one of raising an alarm, shutting down at least part of the electrical heating system, or identifying which of the one or more electrical contacts has a fault by (i) switching on each of the one or more electrical contacts individually, (ii) measuring a second current consumption, and (iii) identifying an electrical contact of the one or more electrical contacts as being faulty if the second current consumption measured when the electrical contact is switched on does not increase.

9. The computer program product according to claim 8, wherein shutting down at least part of the electrical heating system comprises activating one or more circuit breakers.

10. The computer program product according to claim 8, wherein the identifying which of the one or more electrical contacts has a fault comprises:
   comparing the measured current consumption with a lookup table of current consumption values for each electrical contact to identify an electrical contact as being faulty.

11. The computer program product according to claim 8, wherein the predetermined enforced off cycle is of a predetermined duration that is sufficient to enable the identification of a faulty electrical contact.

* * * * *